United States Patent
Zhang et al.

(10) Patent No.: US 9,438,267 B2
(45) Date of Patent: *Sep. 6, 2016

(54) APPARATUS AND METHOD FOR DIGITAL TO ANALOG CONVERSION WITH CURRENT MIRROR AMPLIFICATION

(71) Applicant: Innophase, Inc., Chicago, IL (US)

(72) Inventors: Xuejun Zhang, Chicago, IL (US); Yang Xu, Chicago, IL (US)

(73) Assignee: Innophase, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/955,963

(22) Filed: Dec. 1, 2015

(65) Prior Publication Data

US 2016/0087645 A1 Mar. 24, 2016

Related U.S. Application Data

(63) Continuation of application No. 14/173,595, filed on Feb. 5, 2014, now Pat. No. 9,203,420.

(51) Int. Cl.
| | |
|---|---|
| *H03M 3/00* | (2006.01) |
| *H03M 1/00* | (2006.01) |
| *H03M 1/08* | (2006.01) |
| *G05F 1/625* | (2006.01) |
| *H03F 3/04* | (2006.01) |
| *G05F 3/26* | (2006.01) |
| *H03M 1/74* | (2006.01) |

(52) U.S. Cl.
CPC ............... *H03M 3/50* (2013.01); *G05F 1/625* (2013.01); *G05F 3/262* (2013.01); *H03F 3/04* (2013.01); *H03M 1/00* (2013.01); *H03M 1/002* (2013.01); *H03M 1/0854* (2013.01); *H03M 1/747* (2013.01)

(58) Field of Classification Search
CPC ............ G09G 3/20; G09G 3/30; G09G 3/32; H03M 1/00; H03M 1/66; H03M 1/68; H03M 1/74; H03M 1/0678; H03M 1/745; H03M 1/747; H03M 1/662; H03M 2201/02; H03M 2201/16; H03M 2201/72; H03M 2201/196; H03M 2201/814; H03F 3/04; H03F 3/20; H03F 3/343; H05F 3/26
USPC .......... 341/136–144; 375/233, 295; 327/339, 327/530, 512, 291, 321, 327; 330/285, 253, 330/267, 298
See application file for complete search history.

(56) References Cited

U.S. PATENT DOCUMENTS

| 4,384,274 A | 5/1983 | Mao | |
|---|---|---|---|
| 4,594,577 A * | 6/1986 | Mao | ...................... H03M 1/747 |
| | | | 341/135 |

(Continued)

*Primary Examiner* — Lam T Mai
(74) *Attorney, Agent, or Firm* — Invention Mine LLC

(57) ABSTRACT

A DAC using current mirrors suitable for use in a modulator. Embodiments include a current-generating circuit to provide an information signal; a bias current source; a current mirror having a mirror input transistor connected to the current generating circuit and the bias current source, and being driven by the bias current and the varying current signal and having a corresponding varying voltage signal at a control terminal; a signal shaping filter interposed between the mirror input transistor and an output mirror transistor configured to limit a bandwidth of the varying voltage signal; the output mirror transistor configured to generate a band-limited varying current signal and a mirrored bias current; and, a mirrored bias current reduction circuit connected to the output mirror transistor configured to reduce the mirrored bias current.

24 Claims, 5 Drawing Sheets

(56) References Cited

U.S. PATENT DOCUMENTS

| | | | | |
|---|---|---|---|---|
| 5,739,780 A * | 4/1998 | Cheng | ............... | H03M 1/662 341/135 |
| 6,150,885 A | 11/2000 | Ashby | | |
| 6,545,540 B1 | 4/2003 | Enriquez | | |
| 6,741,195 B1 * | 5/2004 | Cho | ............... | H03M 1/0872 323/315 |
| 7,425,870 B2 * | 9/2008 | Niki | ............... | H03F 3/04 323/315 |
| 7,446,683 B2 * | 11/2008 | Perner | ............... | G05F 3/262 341/133 |
| 7,456,767 B2 * | 11/2008 | Abe | ............... | H03M 1/68 341/135 |
| 7,622,993 B2 * | 11/2009 | Niki | ............... | H03F 3/04 323/315 |
| 7,843,372 B2 * | 11/2010 | Kawano | ............... | H03M 1/0678 327/543 |
| 7,876,297 B2 * | 1/2011 | Maede | ............... | G09G 3/3216 345/211 |
| 7,944,382 B2 * | 5/2011 | Mateman | ............... | H03M 1/664 341/139 |
| 7,982,448 B1 * | 7/2011 | Prasad | ............... | G05F 1/56 323/311 |
| 8,164,499 B1 * | 4/2012 | Booth | ............... | H03M 1/662 338/309 |
| 8,666,325 B2 | 3/2014 | Shute | | |
| 9,203,420 B2 * | 12/2015 | Zhang | ............... | H03M 1/002 |

* cited by examiner

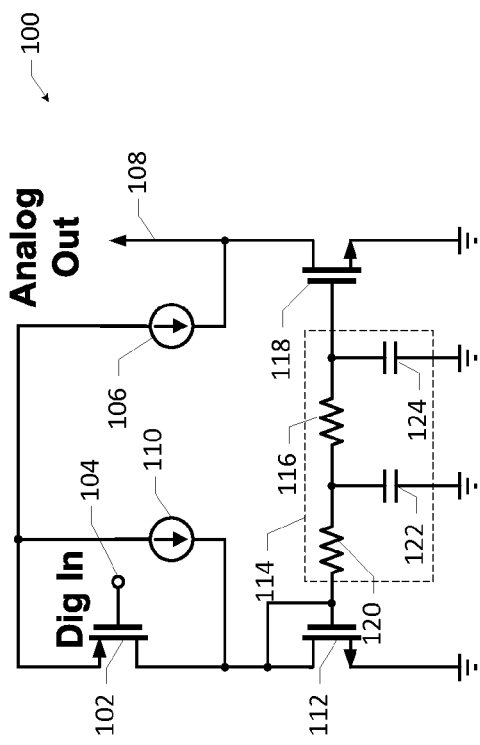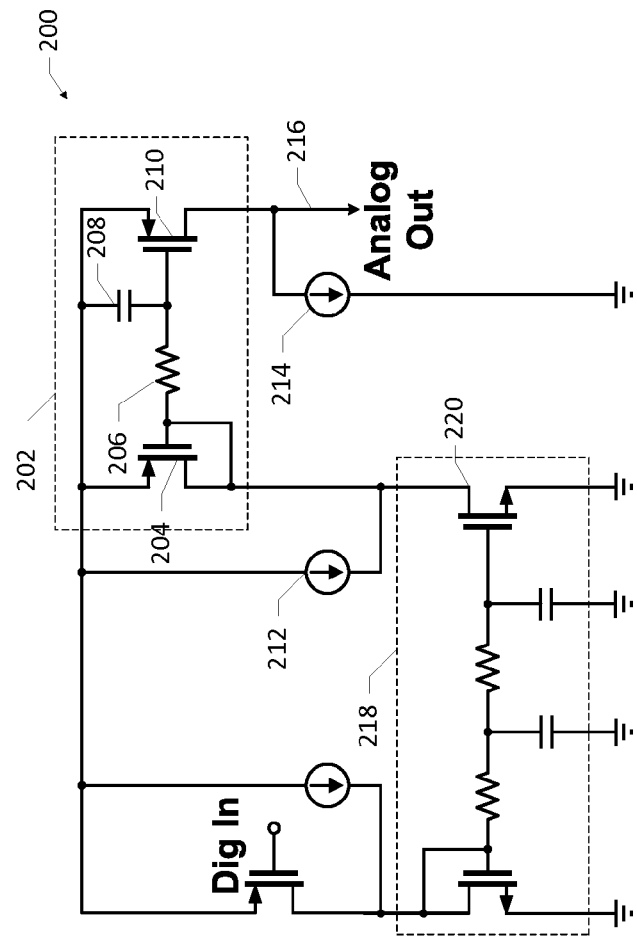
FIG. 1
FIG. 2

APPARATUS AND METHOD FOR DIGITAL TO ANALOG CONVERSION WITH CURRENT MIRROR AMPLIFICATION

CROSS-REFERENCE TO RELATED APPLICATIONS

This application is a continuation of U.S. application Ser. No. 14/173,595, filed Feb. 5, 2014, entitled "APPARATUS AND METHOD FOR DIGITAL TO ANALOG CONVERSION WITH CURRENT MIRROR AMPLIFICATION", reference of which is hereby incorporated in its entirety.

BACKGROUND OF THE INVENTION

Numerous electronic systems include digital-to-analog conversion (DAC) circuits to convert sequences of digital data samples to an analog signal. This allows storage and/or manipulation (e.g., frequency-selective filtering, or general analysis) of the signals via a computer or processor, which operates on quantized signals in a discrete time domain. As a final or penultimate processing step, the signals may be converted to an analog signal by a DAC for use by another circuit, such as by an amplifier. Many such DAC circuits suffer from high power consumption. Typically, various elements of the circuit (e.g., the output nodes coupled to the output resistors) are biased to a voltage level to ensure the circuit elements remain in a desired operating range, for example, to provide a desired linear behavior, or to provide a desired maximum dynamic range of the analog output signal.

Bias signals may cause undesirable power consumption because they may consume electrical current while the system is in a quiescent state. Furthermore, when amplified, an analog signal containing bias currents may result in additional unnecessary power consumption through the amplification of the bias currents. In a transmitting device this may be particularly problematic due to frequent periods of inactivity in between transmissions, and due to high levels of amplification during transmission periods. Furthermore, many transmitting devices, such as mobile phones, laptops, and portable devices, operate on batteries, where high power consumption is undesirable.

Accordingly, there is a need for more power efficient digital-to-analog conversion circuits, particularly for transmitting devices.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIG. 1 is a circuit diagram of a single-ended current mirror amplifier in accordance with some embodiments.

FIG. 2 is a circuit diagram of a two-stage a single-ended current mirror amplifier in accordance with some embodiments.

Figure 3:
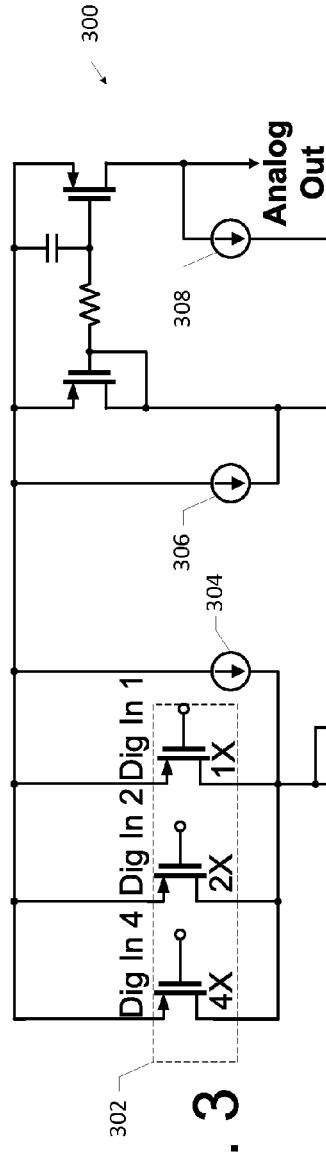
FIG. 3 is a circuit diagram of a multi-bit input, single-ended two-stage current mirror amplifier in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

With respect to FIG. 1, an embodiment of a current mirror amplifier 100 is shown. An input signal is applied at the control node 104 of the input current generator, which in this embodiment is PMOS FET 102. The current-generating circuit is configured to generate a varying current signal proportional to the varying input signal applied to the node 104. The input signal may be a simple single-bit binary signal causing the FET 102 to turn on and off. The current source 110 provides a bias current. The diode-connected NMOS FET 112 conducts both the varying current signal and the bias current from bias current source 110. In some embodiments, the bias current provides an operating point that allows FET 112 to remain in the saturation region of operation even when FET 102 is turned off.

The FET 112 is the input transistor of a current mirror having an output current mirror transistor 118. In some embodiments the output current mirror transistor may be of a larger size than the input transistor so as to provide a current amplification. Such embodiments act to amplify the current signal. In some embodiments the ratio of output transistor size to input transistor size may be 2:1, 4:1 or 8:1. The input transistor 112 is connected to the current generating circuit 102 and the bias current source 110, and is driven by the bias current and the varying current signal. These currents cause a corresponding varying voltage signal at a control terminal, or gate, of FET 112.

A signal shaping filter 114 is interposed between the mirror input transistor FET 112 and the output mirror transistor FET 118. The signal-shaping filter 114 limits the bandwidth of the varying voltage signal. In the embodiment of FIG. 1, the filter is a two-pole RC filter made up of resistor 120 and capacitor 122, and resistor 116 and capacitor 124. The signal-shaping filter in one embodiment is a digital-to-analog reconstruction filter that removes higher-frequency spectral images associated with quantization noise (such as that associated with the well-known stair-step signal shape of an intermediate signal found in some digital-to-analog converters). That is, the pulsed signal generated by switching FET 102 on and off may be smoothed by low-pass filtering to arrive at a more faithful reconstruction of a desired analog signal. In this way the signal-shaping filter is configured to substantially reduce quantization noise associated with the varying voltage signal. In some embodiments, the varying binary signal is a digital baseband signal and the signal-shaping filter removes the quantization noise from the signal provided by a digital baseband processor so that the signal may be used to modulate a carrier frequency.

After filtering, the filtered voltage signal causes the output mirror transistor 118 to generate a band-limited varying current signal and a mirrored bias current. A second bias current 106 may provide output FET 118 with all or substantially all of the mirrored bias current flowing through FET 118. In this manner, the analog output current signal on line 108 has a substantially reduced DC bias current component. In this embodiment, the current source 106 is connected to the output mirror transistor FET 118 and acts as a mirrored bias current reduction circuit.

With respect to FIG. 2, a two-stage circuit is shown, including a first filtering stage 218 and a second current mirror filtering stage 202. The second stage 202 includes another RC filter comprising resistor 206 and capacitor 208. Thus, in this embodiment, the serial connection of the multiple stages provides for a three-pole filter. If stage 202 included another RC filter, a four-pole filter would be achieved. In some embodiments depending on the particular device feature sizes that may be achieved, it may be desirable to limit the number of filter poles that are implemented in a given stage. Because the R and C values (i.e., sizes) may need to be scaled appropriately for serially connected filters, it may be difficult to obtain a set of three resistors and corresponding capacitors that provide the desired signal processing effects. In some embodiments, the feature sizes of resistors may get too large to be an efficient use of chip real estate, or the size of capacitors may get too small and have effects that may be difficult to distinguish from parasitic effects.

Note that current source 212 operates to provide a bias current to stage 218 such that the entire mirrored bias current need not flow through FET 204. In this embodiment, the current source 212 is connected to the output mirror transistor FET 220 and acts as a mirrored bias current reduction circuit. That is, in this embodiment, current source 212 is configured to provide an amount of current to make up most of the mirrored bias current flowing through FET 220. In this manner, the current flowing through FET 204 of the second stage 202 is primarily current associated with the information signal. Note that there may be some remaining bias current such that FET 204 remains in the active region. Removing substantially all of the mirrored bias current refers to removing that portion of the mirrored bias current that is not required to maintain the desired bias condition of the next stage or next signal processing circuit. In other embodiments, removing substantially all of the mirrored bias current refers to removing the DC current component.

Further, with respect to FIG. 2, a second mirror bias current reduction is provided by current source 214. The bias current in FET 204 that remains to keep FET 204 in the linear or active region is mirrored (and possibly amplified) by FET 210. The mirrored bias current is reduced, or removed, from the analog output signal on line 216 by operation of the current source 214 diverting the mirrored bias current. Note also that within this description, the term current source is used simply to refer to a circuit that provides a desired current flow: distinctions are not made between a current source and a current sink, as the distinction between such circuits is well known and not significant to the circuits described herein.

Note that in the embodiment of FIG. 2, as well as in every multi-stage embodiment described herein, the output-to-input transistor size ratios may each be the same such as 4:1 or 8:1, or they may be different, such as stage 218 having a 2:1 ratio, and stage 202 being 4:1, or vice-versa. Any other combination of gain ratios may be used to obtain an overall desired amount of current gain.

With respect to FIG. 3, a multi-bit input is depicted to drive a multi-bit current-generating circuit. The current-generating circuit includes three current source transistors (other embodiments may have two, four or five, etc., depending upon the desired resolution) that receive the varying binary signal. Any of the embodiments depicted herein having a varying binary signal in the form of a serial stream of single bit data may instead utilize a multi-bit data stream using the circuit 302. That is, it is expressly contemplated that any of the embodiments described herein may utilize a multi-bit current-generating circuit. The multi-bit control signal (Dig In 1, Dig In 2, Dig In 4) may be used to control currents in a binary fashion, where the least significant bit (Dig In 1) controls a current source of some predetermined value, say 10 µamps, while the next bit controls a current source of 2×, say 20 µamps, and the third bit controls a current source of 4×, say 40 µamps. Other values of a predetermined value of current may be used. In this embodiment, the current-generating circuit is a plurality of current source transistors, where each of the current source transistors of the plurality generates an amount of current corresponding to a bit position of the multi-bit binary signal. Also depicted in FIG. 3 is a bias current source 304, a mirror bias current reduction circuit comprising current source 306 for the first stage and current source 308 for the second stage.

Figure 4:
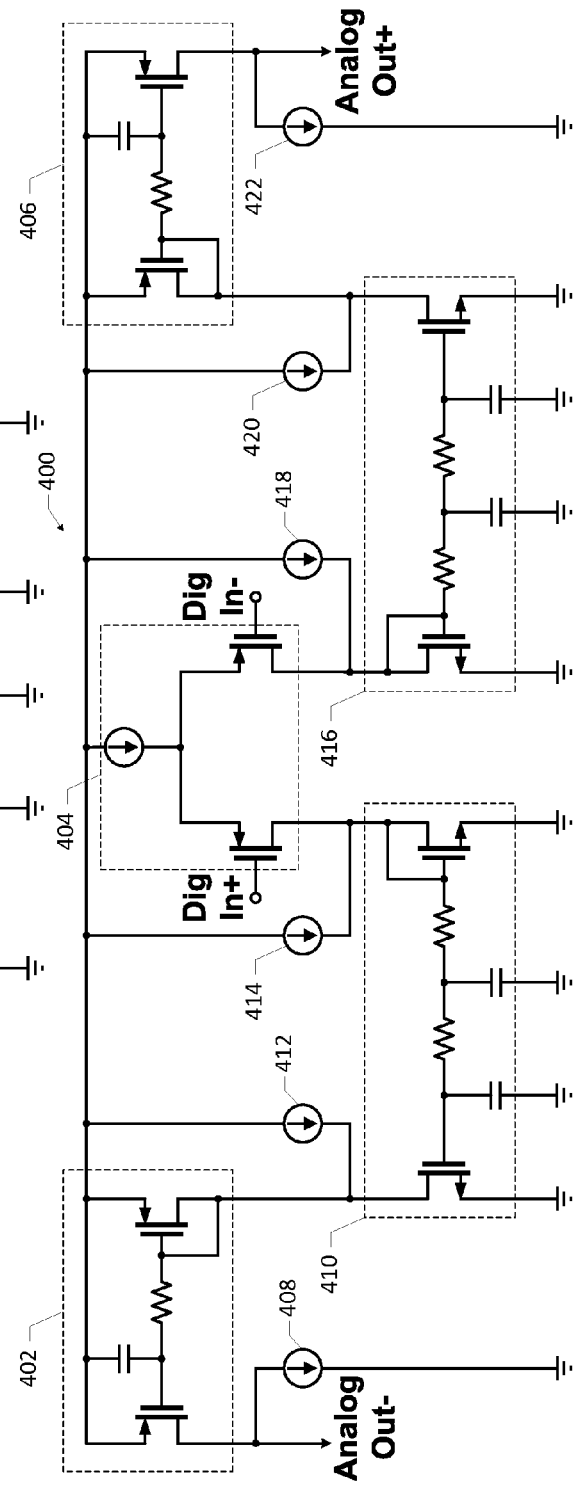
FIG. 4 is a circuit diagram of a differential two-stage current mirror amplifier in accordance with some embodiments.

FIG. 4 shows a differential circuit configuration. The current generating circuit 404 that generates a varying current signal proportional is a differential pair of transistors that receive a varying input signal applied at the nodes labeled Dig In + and Dig In −. The input signal causes the current from the current source in 404 to be diverted to one or the other of the differential pair, which then goes to the respective current mirror circuits 410, 416. A bias current source 414, 418 generates a bias current for each half of the differentially amplified signals. Each current mirror 410, 416 has a mirror input transistor connected to the current generating circuit and the bias current source, and being driven by the bias current and the varying current signal and having a corresponding varying voltage signal at the control terminal (e.g., the gates of the input current mirror FETs). Each half of the differential circuit also has a signal shaping filter interposed between the respective mirror input transistors and the output mirror transistors for limiting a bandwidth of the varying voltage signal. Thus, the output mirror transistors generate a band-limited varying differential current signal and a mirrored bias current. Finally, the a mirrored bias current reduction circuit including current sources 412 and 420 are connected to the output mirror transistors so as to reduce the mirrored bias current in the output signal. Note that the differential circuit of FIG. 4 is a two-stage amplifier/filter, so the differential signal goes through second stage current mirror filters 402 406 and another bias current reduction circuit comprising current sources 408, 422. The embodiment of FIG. 4 therefore depicts a circuit where the current-generating circuit, the current mirror, the signal shaping filter and the mirrored bias current reduction circuit are differential signal circuits.

Figure 5:
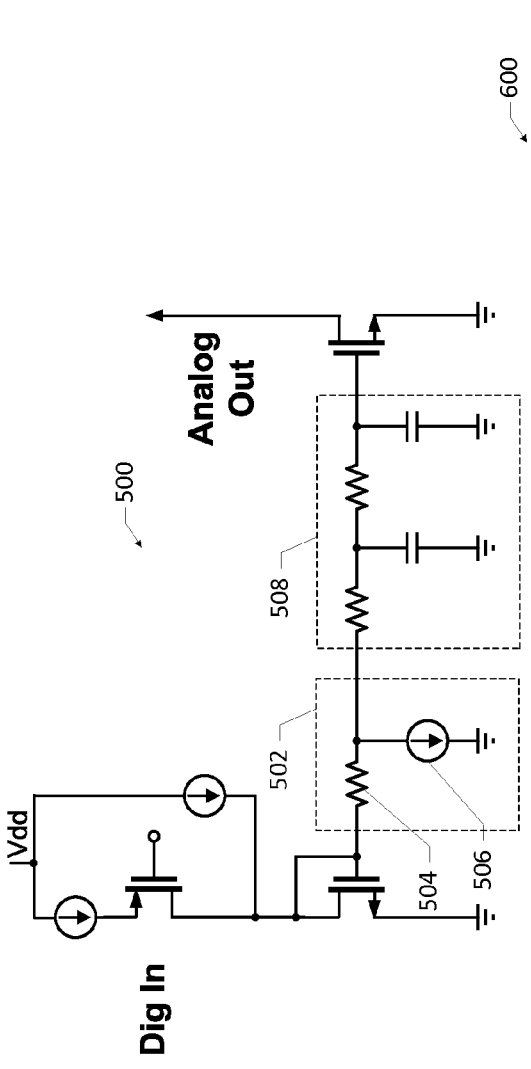
FIG. 5 is a circuit diagram of a single-ended current mirror amplifier in accordance with some embodiments.

An alternative embodiment 500 of FIG. 5 shows a mirrored bias current reduction circuit 502 in the form of a voltage level shifter interposed between the input transistor and the output mirror transistor to provide a voltage offset. The voltage level shifter comprises an offset current source 506 and an offset resistor 504 interposed between the mirror input transistor and the output mirror transistor. Also depicted is the signal-shaping filter 508. The circuit of FIG. 5 is depicted such that the current-generating circuit, the current mirror, the signal shaping filter and the mirrored bias current reduction circuit are single-ended signal circuits, but a fully differential circuit may also use this alternative bias current reduction circuit 502.

Figure 6:
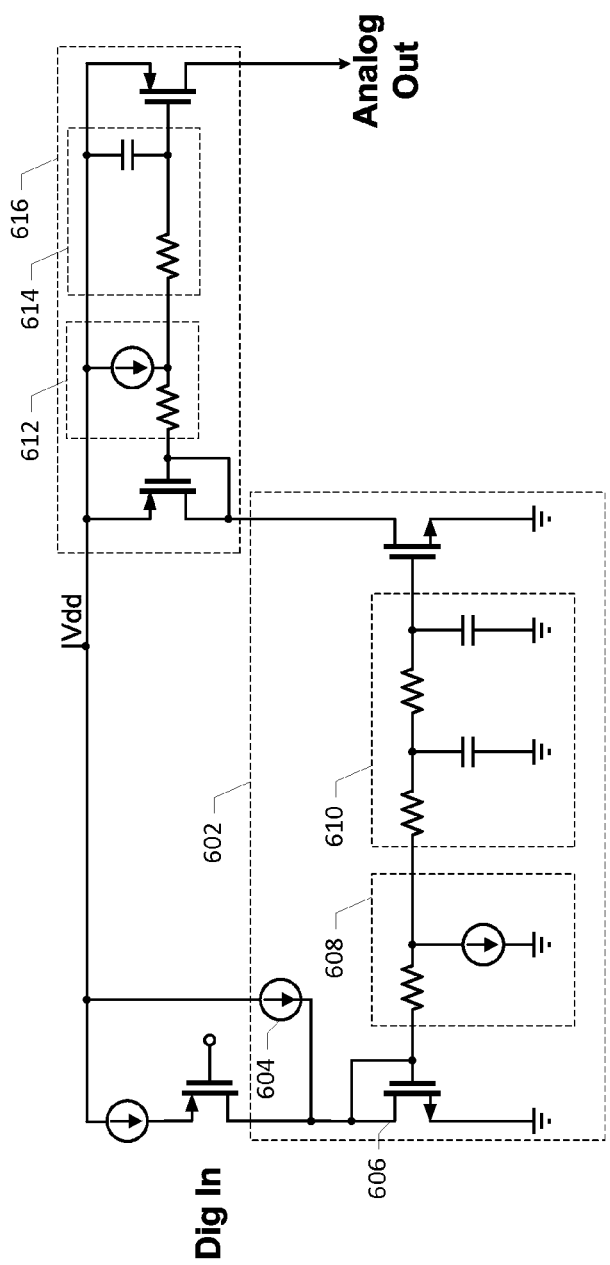
FIG. 6 is a circuit diagram of a two-stage single-ended current mirror amplifier in accordance with some embodiments.

In the circuit 600 of FIG. 6, a two-stage current mirror amplifier/filter is shown having first stage 602 and second stage 616. Bias current source 604 provides a bias current sufficient to keep FET 606 in an active region even while the input signal Dig In causes the current from the current generating circuit to switch on an off. The mirror bias reduction circuit of the level shifter 608 reduces the DC level of the varying voltage signal applied to signal-shaping filter 610, and hence the unnecessary bias current is eliminated from the output current signal. Similarly, the stage two amplifier/filter 616 includes a voltage level shifter 612 prior to the signal-shaping filter 616.

Figure 7:
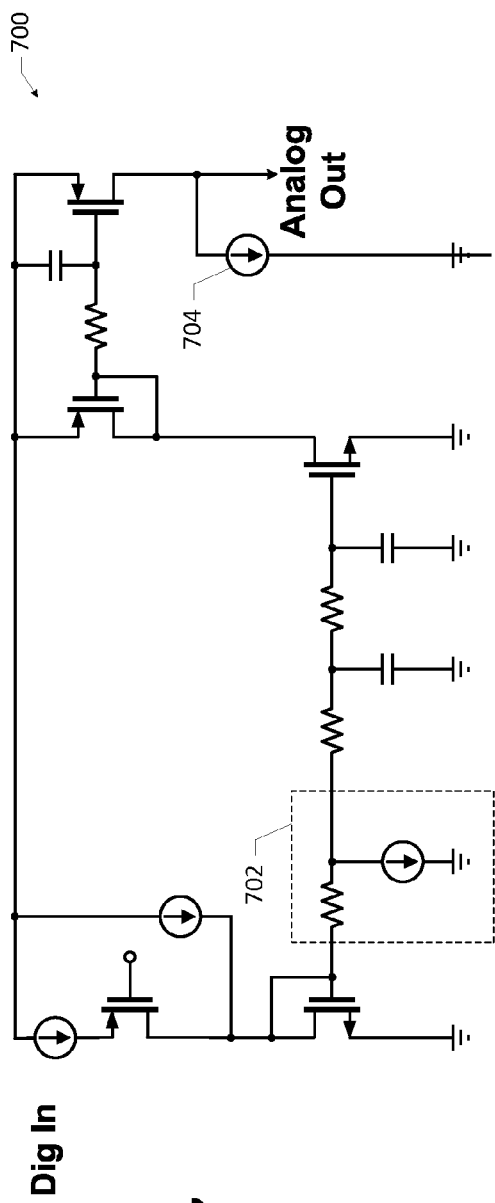
FIG. 7 is a circuit diagram of a two-stage single-ended current mirror amplifier in accordance with some embodiments.
Figure 8:
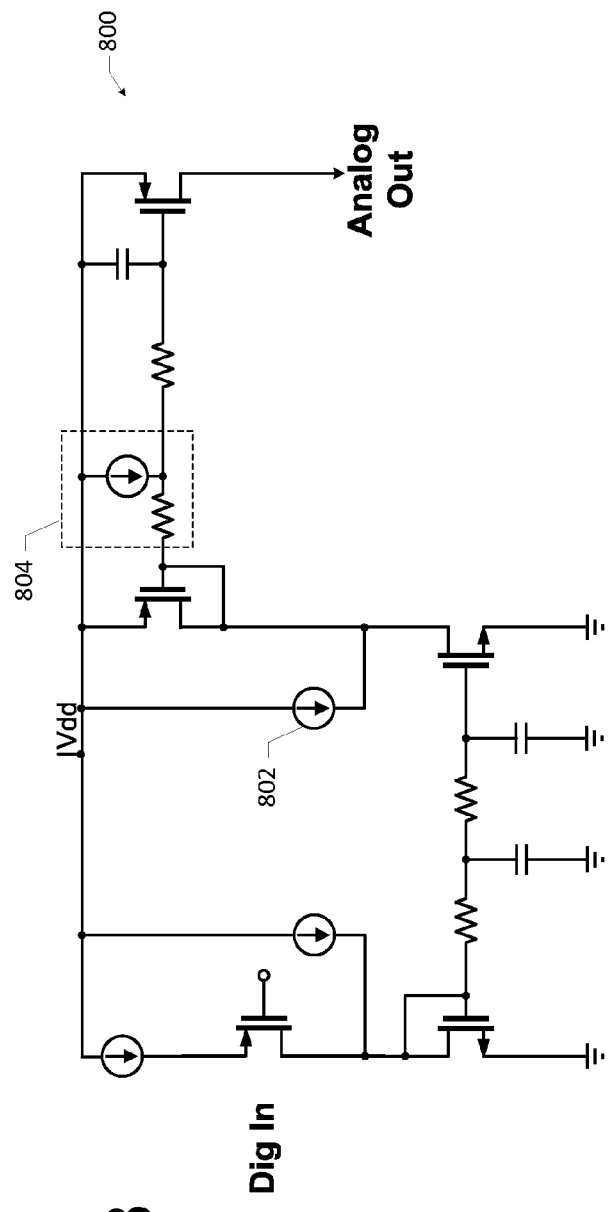
FIG. 8 is a circuit diagram of a two-stage single-ended current mirror amplifier in accordance with some embodiments.

In the circuits 700, 800 of FIGS. 7 and 8, respectively, various alternative embodiments of a two-stage current mirror amplifier/filter are shown. In circuit 700, a mirror bias reduction circuit in the form of a voltage level shifter 702 is used in the first stage while a mirror bias reduction circuit in the form of a current source 704 is used in the second stage. In circuit 800, a mirror bias reduction circuit in the form of a current source 802 is used in the first stage while a mirror bias reduction circuit in the form of a voltage level shifter 804 is used in the second stage.

Figure 9:
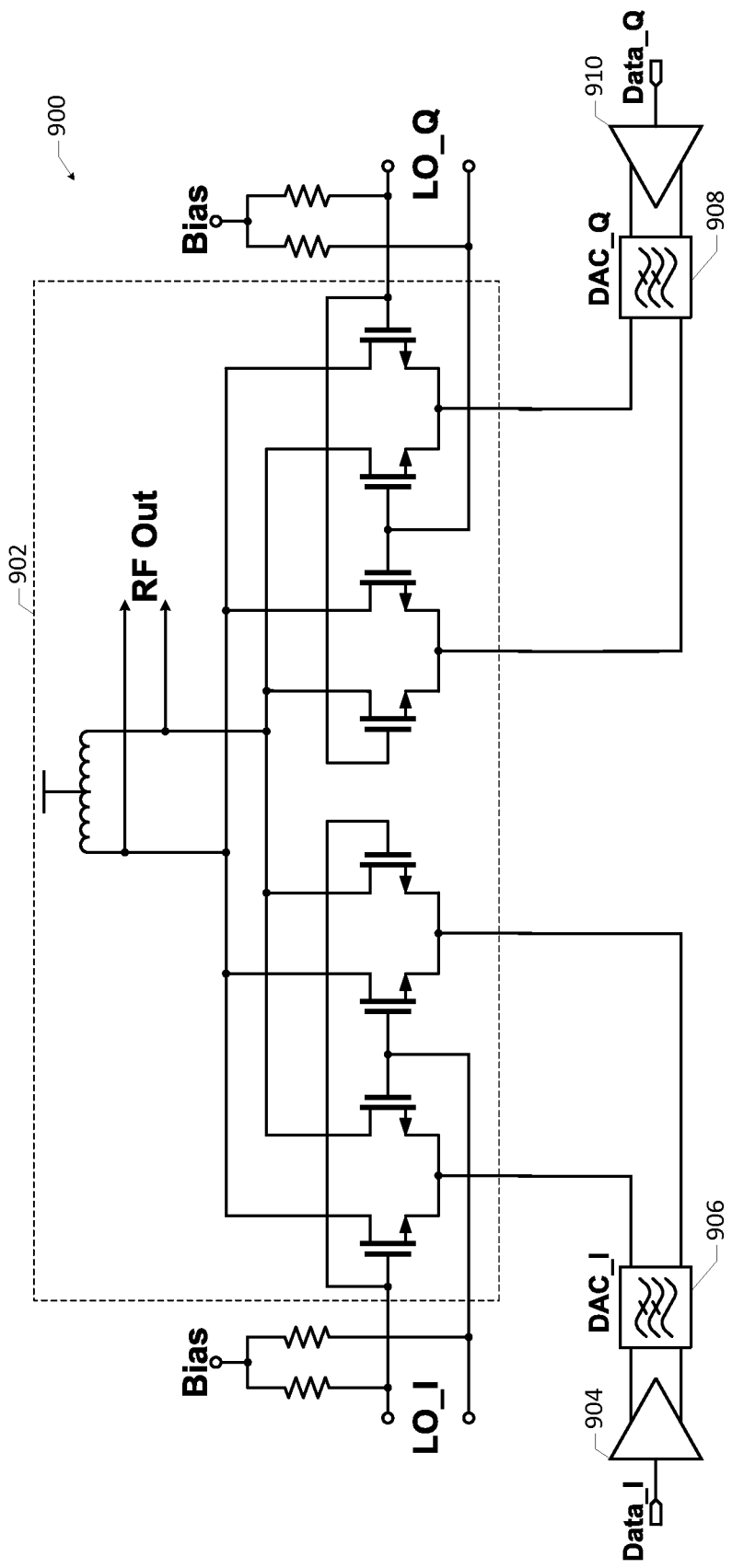
FIG. 9 is a circuit diagram of two differential DACs driving an IQ mixer.

In still further embodiments, the current mirror filter/amplifier may be used to drive a mixer to modulate a carrier signal as depicted in FIG. 9. In one embodiment 900, the mixer 902 is a quadrature current commutating mixer configured to switch the band-limited varying current signal on the inphase (I) and quadrature (Q) channel. The mixer may be switched by a carrier signal generated by a local oscillator, shown as LO_I for the inphase carrier and LO_Q for the quadrature carrier. The carrier may be at a frequency of a desired transmit signal, or it may be at an intermediate frequency. In operation, the binary data signal may be converted to a differential voltage signal by buffers 904, 910. Within the DAC_I 906 the current-generating circuit is driven by the inphase baseband (or near baseband, where "near baseband" refers to a passband signal that can be generated by the binary signal driving the current generating circuit) signal while within and DAC_Q 908, the current-generating circuit is driven by a binary quadrature baseband (or near baseband) signal. The amplifier and reconstruction filters of the DAQ circuits 906, 908, include the mirrored bias current reduction circuit is provided by either current sources or voltage level offset circuits described herein.

In still further embodiments, the current generating signal may be driven by a sigma-delta converter configured to receive a first binary baseband signal having a first number of bits and an associated first sample rate and to generate a second binary signal having a second number of bits, the second number of bits being less than the first number of bits and an associated second sampling rate greater than the first sampling rate. The current source is thus configured to generate a signal current in response to the second binary signal. The current mirror signal amplifier has an input transistor for conducting the signal current and an output current mirror transistor having an amplified signal current. The circuit also includes a digital-to-analog reconstruction filter interposed between the input transistor and an output current mirror transistor. The filter may be a multi-pole RC filter, such as a two-pole RC filter.

The embodiments using a sigma-delta modulator may also include a bias circuit configured to provide an input bias current to the input transistor and a mirrored bias current reduction circuit. The mirrored bias current reduction circuit may be a voltage offset circuit interposed between the input transistor and the output current mirror transistor, or a current source configured to provide a bias current to the output mirror transistor.

In all of the embodiments described herein, some or all of the current mirror topologies may be varied to include cascode current-mirrors to reduce channel modulation effects as is known in the art.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method comprising:
    generating a varying current signal that is proportional to a varying input signal, at a current-generating circuit;
    generating a bias current, at a bias current source;
    driving a mirror input transistor of a current mirror with the bias current and the varying current signal;
    generating a corresponding varying voltage signal at a control terminal of the mirror input transistor;
    limiting a bandwidth of the varying voltage signal with a signal shaping filter that is interposed between the mirror input transistor and an output mirror transistor of the current mirror;
    generating a band-limited varying current signal and a mirrored bias current, at the output mirror transistor; and,
    reducing the mirrored bias current, at a mirrored bias current reduction circuit that is connected to the output mirror transistor.

2. The method of claim 1 wherein the mirrored bias current reduction circuit is a voltage level shifter interposed between the input transistor and the output mirror transistor to provide a voltage offset.

3. The method of claim 2 wherein the voltage level shifter comprises an offset current source and an offset resistor interposed between the mirror input transistor and the output mirror transistor.

4. The method of claim 1 wherein the mirrored bias current reduction circuit is a current source configured to provide a bias current to the output mirror transistor.

5. The method of claim 1 wherein the current-generating circuit is one or more current source transistors configured to receive the varying input signal.

6. The method of claim 1 wherein the current-generating circuit, the current mirror, the signal shaping filter and the mirrored bias current reduction circuit are differential signal circuits.

7. The method of claim 1 wherein the current-generating circuit, the current mirror, the signal shaping filter and the mirrored bias current reduction circuit are single-ended signal circuits.

8. The method of claim 1 wherein the varying input signal is a binary signal.

9. The method of claim 1 wherein the varying input signal is a serial stream of single bit data.

10. The method of claim 1 wherein the varying input signal is a multi-bit binary signal.

11. The method of claim 10 wherein the current-generating circuit is a plurality of current source transistors, each of the current source transistors of the plurality being configured to generate an amount of current corresponding to a bit position of the multi-bit binary signal.

12. The method of claim 11 wherein the output mirror transistor is larger than the input transistor to provide current amplification.

13. The method of claim 1 wherein the signal-shaping filter is configured to substantially reduce quantization noise associated with the varying voltage signal.

14. The method of claim 1 wherein the varying input signal is a digital baseband signal.

15. The method of claim 1 further comprising switching the band-limited varying current signal at a mixer.

16. The method of claim 15 wherein the mixer is switched by a carrier signal.

17. A method comprising:
    receiving, at a sigma-delta converter, a first binary baseband signal having a first number of bits and an associated first sample rate;
    generating, at the sigma-delta converter, a second binary signal having (i) a second number of bits, the second number of bits being less than the first number of bits and (ii) an associated second sampling rate, the second sampling rate being greater than the first sampling rate;
    generating, at a current source, a signal current in response to the second binary signal; and,
    driving an input transistor of a current mirror signal amplifier with the signal current to produce a varying voltage signal;
    passing the varying voltage signal through a digital-to-analog reconstruction filter interposed between the input transistor and an output current mirror transistor of the current mirror signal amplifier; and,
    outputting an amplified signal current, at the output current mirror transistor.

18. The method of claim 17 wherein the digital-to-analog reconstruction filter is a two-pole RC filter.

19. The method of claim 17 further comprising providing an input bias current to the input transistor, via a bias circuit.

20. The method of claim 19 further comprising reducing a mirrored bias current, at a mirrored bias current reduction circuit that is connected to the output mirror transistor.

21. The method of claim 20 wherein the mirrored bias current reduction circuit is a current source configured to provide a bias current to the output mirror transistor.

22. The method of claim 19 further comprising reducing a mirrored bias current via a voltage offset circuit interposed between the input transistor and the output current mirror transistor.

23. The method of claim 17 further comprising switching the band-limited varying current signal, at a mixer.

24. The method of claim 23 wherein the mixer is switched by a carrier signal.

* * * * *